United States Patent
Van Damme et al.

(10) Patent No.: US 6,641,970 B2
(45) Date of Patent: Nov. 4, 2003

(54) UV-SENSITIVE IMAGING ELEMENT FOR MAKING LITHOGRAPHIC PRINTING PLATES COMPRISING AN ARYLDIAZOSULFONATE POLYMER AND A COMPOUND SENSITIVE TO UV LIGHT

(75) Inventors: Marc Van Damme, Bonheiden (BE); Peter Hendri kx, Hamont-Achel (BE); Huub Van Aert, Pulderbos (BE)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 10/159,408

(22) Filed: May 30, 2002

(65) Prior Publication Data

US 2003/0082476 A1 May 1, 2003

Related U.S. Application Data

(60) Provisional application No. 60/307,462, filed on Jul. 24, 2001.

(30) Foreign Application Priority Data

Jun. 13, 2001 (EP) .............................. 01000211

(51) Int. Cl.$^7$ .............................. G03C 1/56; G03F 7/30
(52) U.S. Cl. ................. 430/164; 430/188; 430/302
(58) Field of Search .................. 430/188, 302, 430/164

(56) References Cited

U.S. PATENT DOCUMENTS

| | | | | |
|---|---|---|---|---|
| 3,174,860 A | * | 3/1965 | Sus et al. ................... | 430/175 |
| 3,230,087 A | * | 1/1966 | Sus et al. ................... | 430/175 |
| 3,856,528 A | * | 12/1974 | Levinos ...................... | 430/148 |
| 3,909,273 A | * | 9/1975 | Levinos ...................... | 430/188 |
| 5,046,481 A | * | 9/1991 | Warwick ...................... | 126/522 |
| 5,786,128 A | * | 7/1998 | Vermeersch et al. ......... | 430/302 |
| 6,096,471 A | * | 8/2000 | Van Damme et al. ......... | 430/188 |
| 6,214,515 B1 | * | 4/2001 | Van Damme et al. ......... | 430/188 |
| 6,300,032 B1 | * | 10/2001 | Van Damme et al. ......... | 430/188 |

FOREIGN PATENT DOCUMENTS

| | | |
|---|---|---|
| EP | 0 353 873 A1 | 2/1990 |
| EP | 0 399 755 A1 | 11/1990 |
| EP | 0 507 008 A1 | 10/1992 |
| EP | 0 771 645 A1 | 5/1997 |
| EP | 0 960 730 A1 | 12/1999 |

OTHER PUBLICATIONS

Search report for EP 01 00 0211 ( Nov. 7, 2001).

* cited by examiner

*Primary Examiner*—John S. Chu
(74) *Attorney, Agent, or Firm*—Leydig, Voit & Mayer, Ltd.

(57) ABSTRACT

An imaging element is disclosed for making a lithographic printing plate comprising a lithographic support and an imaging layer comprising (i) a polymer having aryldiazosulfonate units and/or aryltriazenylsulfonate units and (ii) a compound capable of generating a radical and/or an acid upon exposure to UV light. The imaging element can be exposed by UV light and developed by water or an aqueous solution. Exposure and/or development can be performed on or off press.

9 Claims, No Drawings

UV-SENSITIVE IMAGING ELEMENT FOR MAKING LITHOGRAPHIC PRINTING PLATES COMPRISING AN ARYLDIAZOSULFONATE POLYMER AND A COMPOUND SENSITIVE TO UV LIGHT

This application claims the benefit of U.S. Provisional Patent Application No. 60/307,462, filed Jul. 24, 2001, which is incorporated by reference.

FIELD OF THE INVENTION

The present invention relates to an imaging element for making lithographic printing plates.

More specifically the invention is related to an UV sensitive imaging element that can be developed on or off press.

BACKGROUND OF THE INVENTION

Lithographic printing presses use a so-called printing master such as a printing plate that is mounted on a cylinder of the printing press. The master carries a lithographic image on its surface and a print is obtained by applying ink to said image and then transferring the ink from the master onto a receiver material, which is typically paper. In conventional (so-called 'wet') lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

In recent years the so-called computer-to-plate method has gained a lot of interest. This method, also called direct-to-plate method, bypasses the creation of film because the digital document is transferred directly to a plate precursor by means of a so-called plate-setter. A special type of a computer-to-plate process involves the exposure of a plate precursor while being mounted on a plate cylinder of a printing press by means of an image-setter that is integrated in the press. This method is often called 'computer-to-press' and printing presses with an integrated plate-setter are sometimes called digital presses. A review of digital presses is given in the Proceedings of the Imaging Science & Technology's 1997 International Conference on Digital Printing Technologies (Non-Impact Printing 13). Computer-to-press methods have been described in e.g. EP-A 770 495, EP-A 770 496, WO 94001280, EP-A 580 394 and EP-A 774 364. In most computer-to-press methods so-called thermal or heat-mode materials are used, i.e. plate precursors or on-press coatable compositions that comprise a compound that converts absorbed light into heat. The heat which is generated on image-wise exposure triggers a (physico-) chemical process, such as ablation, polymerization, insolubilization by cross-linking of a polymer, decomposition, or particle coagulation of a thermoplastic polymer latex, and after optional processing, a lithographic image is obtained.

Typical plate materials used in computer-to-plate methods are based on ablation. A problem associated with ablative plates is the generation of debris that is difficult to remove and may disturb the printing process or may contaminate the exposure optics of the integrated image-setter. Other methods require wet processing with chemicals which may damage or contaminate the electronics and optics of the integrated image-setter and other devices of the press. Therefore computer-to-press methods normally require the use of plate materials which are not ablative and do not need wet processing. Known examples of such non-ablative processless plate materials contain a so-called 'switchable' image-recording layer, i.e. a layer of which the affinity towards ink or an ink-abhesive fluid can be converted upon image-wise exposure from one state to the opposite state, e.g. from hydrophilic to oleophilic or from ink-accepting to ink-abhesive. Such materials are based on

- switchable polymers (e.g. EP-A 924 102) which can be image-wise converted from a hydrophobic state to a hydrophilic state (WO92/09934; EP 652 483) or vice-versa (U.S. Pat. No. 4,081,572; EP-A 200 488; EP-A 924 065).
- thermally induced coalescence of thermoplastic polymer particles in a crosslinked binder (U.S. Pat. No. 3,476, 937; EP-A 882 583; Research Disclosure no. 33303).
- thermally induced rupture of microcapsules and the subsequent reaction of the microencapsulated oleophilic compounds with functional groups on cross-linked hydrophilic binders (U.S. Pat. No. 5,569,573; EP-A 646 476; EP-A 949 088).

A non-ablative plate which can be processed with fountain and ink is described in EP-B 770 494. The latter patent specification discloses a method wherein an imaging material comprising an image-recording layer of a hydrophilic binder, a compound capable of converting light to heat and hydrophobic thermoplastic polymer particles, is image-wise exposed, thereby converting the exposed areas into an hydrophobic phase which define the printing areas of the printing master. The press run can be started immediately after exposure without any additional treatment because the layer is processed by interaction with the fountain and ink that are supplied to the cylinder during the press run. So the wet chemical processing of these materials is 'hidden' to the user and accomplished during the first runs of the printing press.

EP-A 339393 and EP-A 507008 disclose the use of aryldiazosulfonate resins in a photosensitive layer of an imaging element for making a lithographic printing plate. According to these disclosures, the imaging elements can be developed by rinsing them with plain water. However, the sensitivity of these systems to UV-light is low.

The use of UV-light for image-wise exposure of printing plates is advantageous in view of the widespread availability of UV contact frames (analogue exposure) and the emerging technologies for direct (digital) exposure with UV-light by means of digitally modulated UV sources using UV lasers or UV lamps with digital mirror devices, light valves etc.

OBJECTS AND SUMMARY OF THE INVENTION

It is an object of the present invention to provide an imaging element for making a lithographic printing plate having an improved sensitivity to UV-light that can be developed with an aqueous solution on or off the press. The above mentioned objects are realized by the imaging element having the specific features defined in claim 1.

It is a further object of the present invention to provide a method for making a lithographic printing plate using the imaging element defined in claim 1. This object is realized by the method of claim 5.

The imaging element defined in claim 1 comprises a polymer having aryldiazosulfonate units or aryltriazenylsulfonate units. The addition of a compound capable of generating a radical and/or acid upon exposure to UV light increases the sensitivity of the imaging element towards UV-light.

Specific features for preferred embodiments of the invention are disclosed in the dependent claims.

Further advantages and embodiments of the present invention will become apparent from the following description.

DETAILED DESCRIPTION OF THE INVENTION

According to the present invention the imaging element for making a lithographic printing plate comprises an imaging layer comprising (i) a polymer having aryldiazosulfonate units and/or aryltriazenylsulfonate units and (ii) a compound capable of generating a radical and/or an acid upon exposure to UV light, which is typically the wavelength range between 100 nm and 400 nm.

According to the present invention, the addition of a compound capable of generating a radical and/or acid upon exposure to UV light increases the sensitivity of the imaging element. The radical and/or acid generating compounds that can be used in the present invention have a sensitivity in the range of UV light. These compounds are frequently used as photoinitiators for free radical and cationic polymerization. A detailed description of compounds useful in the present invention can be found in: 'Chemistry and Technology of UV and EB Formulation for Coatings, Inks and Paints, volume 3, Photoinitiators for free radical and cationic polymerization' ed. K. K. Dietliker. Specific examples of such compounds can be selected from the group consisting of a compound having a carbon-halogen bond, an aromatic onium salt, an organic peroxide, a thio compound, a hexaarylbisimidazole or a ketoxime ester. More specific examples of such compounds can be found in U.S. Pat. No. 5,049,481. Preferably halomethyl-s-triazines, thioxanthones, hexaarylbisimidazoles and/or mercaptobenzoxazoles are used.

A polymer having aryldiazosulfonate units preferably is a polymer having aryldiazosulfonate units corresponding to the following formula:

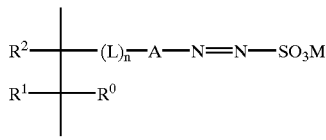

wherein $R^{0,1,2}$ each independently represent hydrogen, an alkyl group, a nitrile group or a halogen group, L represents a divalent linking group, n represents 0 or 1, A represents an aryl group and M represents a cation.

L preferably represents a divalent linking group selected from the group consisting of:

wherein t represents 0 or 1, $R^3$ represents hydrogen, an alkyl group or an aryl group, X represents an alkylene group, an arylene group, an alkylenoxy group, an arylenoxy group, an alkylenethio group, an arylenethio group, an alkylenamino group, an arylenamino group, oxygen, sulfur or an aminogroup.

A preferably represents an unsubstituted aryl group, e.g. an unsubstituted phenyl group or an aryl group, e.g. phenyl, substituted with one or more alkyl group, aryl group, alkoxy group, aryloxy group or amino group.

M preferably represents a cation such as $NH_4^+$ or a metal ion such as a cation of Al, Cu, Zn, an alkaline earth metal or alkali metal.

A polymer having aryltriazenylsulfonate units preferably corresponds to the following formula:

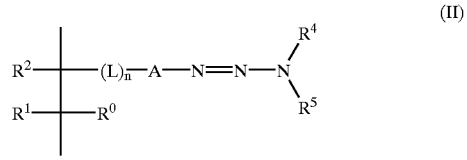

wherein $R^{0,1,2}$, L, A, n are the same as defined above, $R^4$ and $R^5$ are independent and represent a hydrogen, a heterocyclic group, an aliphatic group, an aromatic group or an alicyclic group; and at least one of $R^4$ and $R^5$ is substituted with a sulfonate group.

A polymer having aryldiazosulfonate units or aryltriazenylsulfonate units is preferably obtained by radical polymerization of a corresponding monomer or mixtures of monomers, having an aryldiazosulfonate or aryltriazenylsulfonate pending group. Suitable monomers for use in accordance with the present invention are aryldiazosulfonate-substituted derivatives or aryltriazenylsulfonate-substituted derivatives of styrene, (meth)acrylic acid, (meth)acrylate ester, maleic acid, (meth) acrylonitrile, vinyl ethers, allyl ethers, vinyl esters, acroleins, (meth)acrylamides, maleic anhydride, maleate esters, vinyl halides, vinyl thioesters, vinyl nitriles, vinyl alcohol, vinyl ketones, itaconic acid, crotonic acid, itaconic esters, crotonic esters, olefines, vinyl imidazole, vinyl pyridine, vinyl pyrrolidone, vinyl carbazole, vinyl acetamide, vinyl quinoline, vinyl formamide, maleimides.

The above monomers, can be homopolymerized or copolymerized with non-sulfonate-substituted monomers, e.g. vinyl monomers such as (meth)acrylic acid or esters thereof, (meth)acrylamide, acrylonitrile, vinylacetate, vinylchloride, vinylidene chloride, styrene, alpha-methyl styrene etc. In case of copolymers however, care should be taken not to impair the water solubility of the polymer. Preferably, the amount of aryldiazosulfonate groups in a polymer in connection with this invention is between 10 mol % and 60 mol %.

According to another embodiment in connection with the present invention, an aryldiazosulfonate-containing polymer may be prepared by reacting a polymer having e.g. acid groups or acid halide groups with an amino or hydroxy substituted aryldiazosulfonate or aryltriazenylsulfonate. Further details on this procedure can be found in EP-A 507008.

Furthermore, the image-forming layer may comprise additional compounds such as colorants, surfactants or binders. Preferably anionic colorants are used. Suitable examples of such colorants are Patent Blau V, bromocresol green, acid black 1, chlorophenol red. These colorants provide a visible image after exposure by changing color or hue upon exposure to actinic radiation or upon contact with the products from the exposed compound capable of generating a radical and/or acid upon exposure to UV-light. Suitable colorants include, but are not limited to leuco dyes such as acyl protected thiazines, diazines and oxazines, hydrols (e.g. Michler's hydrol), indolinenes and triaryl methane lactones (e.g. Crystal Violet Lactone). Preferably the dyes include substituted triaryl methane type leuco dyes. The dyes are preferably present in an amount sufficient to achieve the desired contrast between exposed and unexposed areas e.g. between 0% and 10% of the imaging layer.

According to the present invention, the lithographic base can be an anodized aluminum. A preferred lithographic base is an electrochemically grained and anodized aluminum support. According to the present invention, an anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a hydrophilic layer comprising a cross-linked hydrophilic binder. A particularly suitable hydrophilic layer may be obtained from a hydrophilic binder cross-linked with a cross-linking agent such as formaldehyde, glyoxal, polyisocyanate or a hydrolyzed tetra-alkylorthosilicate. The latter is particularly preferred.

As hydrophilic binder there may be used hydrophilic (co) polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co) polymer or (co) polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

The exposure of the imaging element used in the present invention proceeds with UV-light by means of the known UV exposure devices. Useful examples are high or medium pressure halogen mercury vapor lamps, or lasers emitting in the UV wavelength range. The exposure to UV-light can be an analogue exposure be means of an UV-contact frame or a direct digital exposure by means of digitally modulated UV-sources using UV-lasers or UV-lamps with digital mirror devices, light valves etc.

Subsequent to image-wise exposure, the imaging element is developed by applying water or an aqueous solution off or on the press. Preferably the aqueous solution is a fountain solution. Furthermore, during development ink can be provided. The ink can be provided together with the fountain solution or first the fountain solution and subsequently the ink is supplied.

Alternatively, the imaging element is first mounted on the printing press. Image-wise exposure and development are performed on the press.

Upon exposure the imaging layer becomes insoluble in water or an aqueous solution and thus can no longer be dissolved during the development step.

After development the imaging element can be overall exposed to UV light to harden the image and increase the run length of the printing plate.

The invention will now be illustrated by the following examples without however the intention to limit the invention thereto. All parts and percentages are by weight unless stated otherwise.

EXAMPLES

Ingredients

Patent Blau V: contrast dye available from Hoechst
s-Triazine: photoinitiator available from PCAS
bis-4,4'-(diethylamino)benzophenon (BDEABP) available from Aldrich
ortho-chlorohexaarylbisimidazole (HABI) available from Hodogaya Chemicals
2-mercaptobenzoxazole (MBO) available from Aldrich
Triazine p available from PCAS
Leuco Crystal Violet available from Aldrich Preparation of Sodium Methacryloyl Aminophenyl Diazosulfonate Monomer The synthetic route can be divided into 3 steps as shown below:

1. acylation of nitro aniline with methacryloyl chloride
2. chemical reduction with iron/acetic acid
3. diazotation and work-up with sodium sulfite.

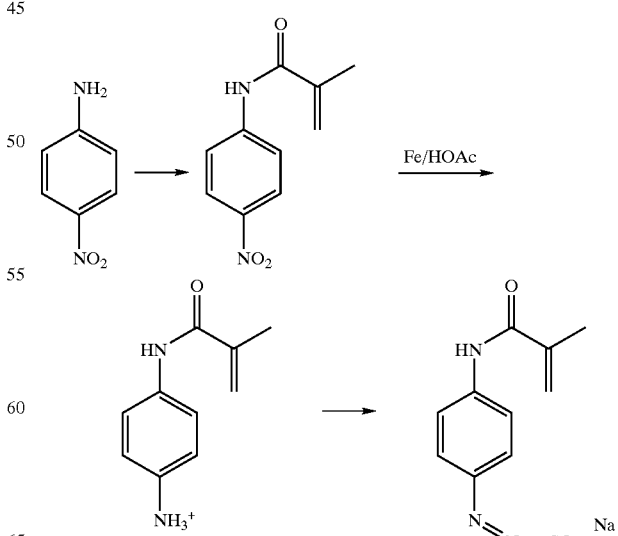

1. Synthesis of 2-methyl-N-(4-nitro phenyl) acrylamide

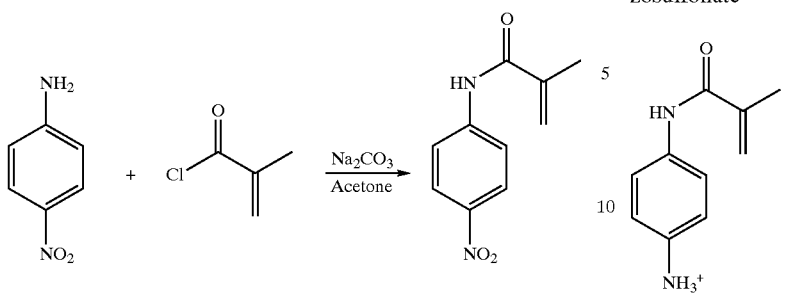

To a suspension of 345 g of 4-nitro aniline (=2.5 mol) and 290 g of $Na_2CO_3$ (=2.75 mol=1.1 equiv.) in 2,5 L acetone 275 ml of methacryloyl chloride (=2.75 mol=1.1 equiv.) was added dropwise while gently cooled.

After completing the addition stirring was continued for 30 min at 30° C.

After TLC inspection the reaction mixture was poured into 15 L of ice water under stirring. The precipitate was suction-filtered and washed with 3 times 2,5 L of demineralized water. After drying at 50° C., 476.5 g of 2-methyl-N-(4-nitro-phenyl) acrylamide was obtained (i.e. 92.5% versus 515 g theor.).

2. Synthesis of N-(4-amino phenyl)-2-methyl acrylamide hydrochloride

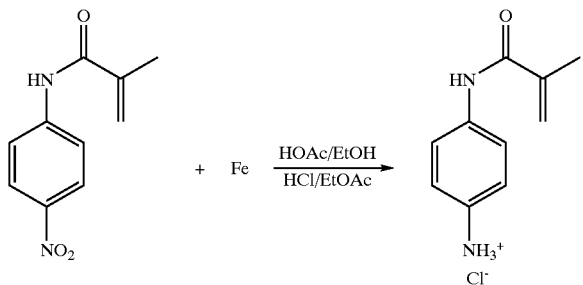

A mixture of 114 g of 2-methyl-N-(4-nitro phenyl) acrylamide (=0.55 mol) and 92.6 g of Fe powder (=1.65 mol 3 mol equiv.) in 420 ml of ethanol was refluxed. Upon refluxing 400 ml of acetic acid (=6.6 mol=12 mol equiv.) was added. A proper cooling and a safe gas separation were ensured. During the first reaction step a very strong exothermic gas release occurred. After completing of the addition of acetic acid, stirring while refluxing was continued for 60 min. After TLC inspection 300 ml of ethyl acetate was added and the Fe salts were suction-filtered. The salts were then washed with 1.9 L of ethyl acetate. While stirring, 138 ml of HCl conc. (1.65 mol=3 equiv.) was added to the filtrate. The mixture was cooled to 5° C. while stirring. The precipitate was suction-filtered and washed with ethyl acetate. After drying at 40° C. 85 g of N-(4-amino phenyl)-2-methyl acrylamide hydrochloride was obtained (i.e. 72% versus 117 g theor.)

3. Synthesis of sodium-4-methacryloyl amino phenyl diazosulfonate

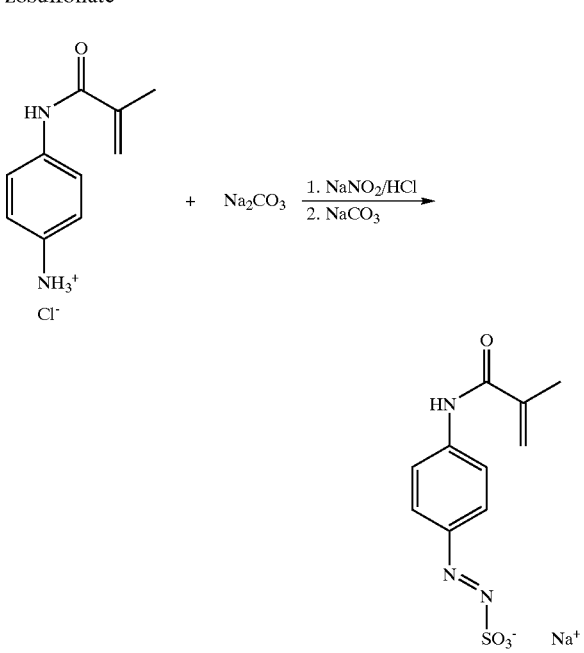

A suspension of 268 g of N-(4-amino phenyl)-2-methyl acrylamide hydrochloride (=1.26 mol) in 1260 ml of demineralized water was cooled to 10° C. After adding 290 ml of HCl conc. (=2.75 equiv.) cooling was continued to 5° C. Next, a solution of 91.5 g of sodium nitrite (=1,05 equiv.) in 180 ml of $H_2O$ was added dropwise. After stirring for 30 min at 5° C. the solution obtained was added to a solution of 318 g of sodium sulfite (=2.52 mol=2.0 equiv.) and 401 g of $Na_2CO_3$ (=3.0 equiv.) in 1900 ml of demineralized water. After stirring for 2 h at 5° C. the reaction mixture was poured in 500 ml of ethanol. The salts were suction-filtered and the filtrate was concentrated by evaporation. The residue was agitated in a mixture of 4100 ml of ethanol and 1260 ml demineralized water. The suction-filtered product still contained part of the salts. The precipitate was suction-filtered and washed with ethanol (500 ml). Yield 164 g of sodium-4-methacryloyl amino phenyl diazosulfonate (i.e. 44% versus. 373 g theor.)

Preparation of aryldiazosulfonate copolymer

The described copolymer is a copolymer of methylmethacrylate (MMA) and sodium methacryloyl aminophenyl diazosulfonate in a 86/16 molar ratio, as shown in the scheme below:

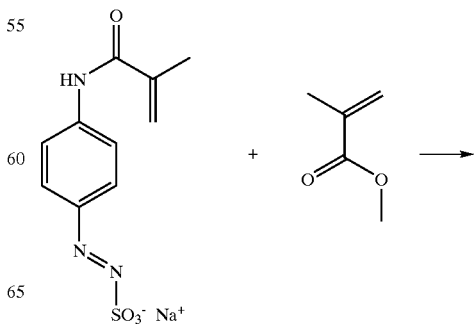

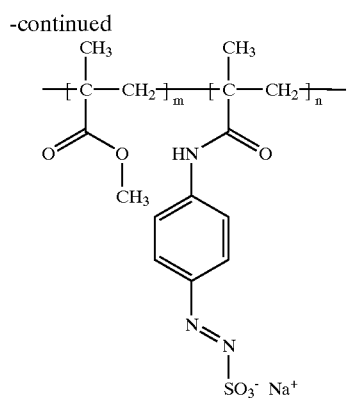

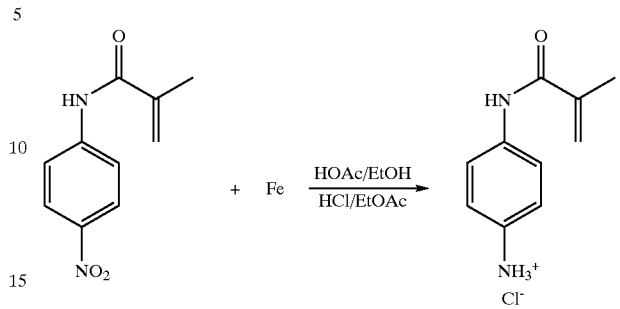

The polymerization is performed in a darkroom using yellow light, in order to prevent premature decomposition of the light sensitive aryldiazosulfonate unit. 482.6 grams (4.82 mol) of MMA, 267.4 gram (0.92 mol) sodium 4-methacryloylaminophenyl diazosulfonate, 2521 grams of isopropanol and 2825.5 grams of water were added to a 5 liter double-jacketed reactor. A jacketed coil reflux condenser and a magnetic stirrer are installed and the reaction flask is flushed with nitrogen. After 10 minutes, 630 grams of a 5 wt. % aqueous solution of 4,4'-azobis (4-cyanopentanoic acid) sodium salt is added and the reactor is heated up to the polymerization temperature of 70° C. After 6 hours again 270 grams of a 5 wt. % aqueous solution of 4,4'-azobis (4-cyanopentanoic acid) sodium salt is added, in order to give high monomer conversions. The polymerization is continued overnight and after a total reaction time of 24 hours the reaction mixture is cooled to room temperature. The polymer solution is used as obtained from the polymerization, without further purification. The final concentration of the obtained copolymer solution is 17.5 wt. % having a viscosity of 32.3 mPas. The azogroups containing substances have to be protected from light e.g. by darkening the room or wrapping the flasks with aluminum foil.

Preparation of Sodium Methacrylamido-2-(3-phenyl-1-methyl-2-triazenyl)ethanesulfonate Monomer
1. acylation of nitro aniline with methacryloyl chloride
2. chemical reduction with iron/acetic acid
3. diazotation and work-up with sodium sulfite.
1. Synthesis of 2-methyl-N-(4-nitro phenyl) acrylamide

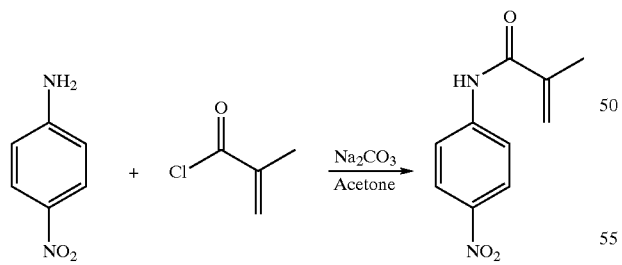

To a suspension of 345 g of 4-nitro aniline (=2.5 mol) and 290 g of Na$_2$CO$_3$ (=2,75 mol=1.1 equiv.) in 2,5 L acetone 275 ml of methacryloyl chloride (=2.75 mol=1.1 equiv.) was added dropwise while gently cooled.

After completing the addition stirring was continued for 30 min at 30° C.

After TLC inspection the reaction mixture was poured into 15 L of ice water under stirring. The precipitate was suction-filtered and washed with 3 times 2,5 L of demineralized water. After drying at 50° C., 476.5 g of 2-methyl-N-(4-nitro-phenyl) acrylamide was obtained (i.e. 92.5% versus 515 g theor.).

2. Synthesis of N-(4-amino phenyl)-2-methyl acrylamide hydrochloride

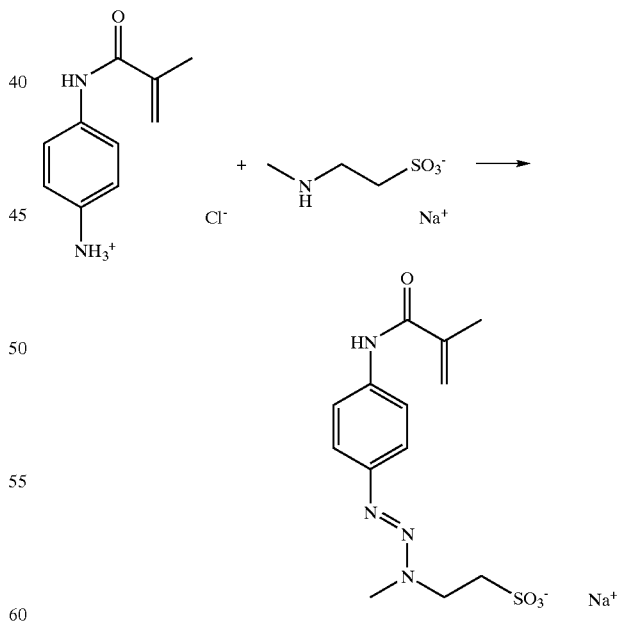

A mixture of 114 g of 2-methyl-N-(4-nitro phenyl) acrylamide (=0.55 mol) and 92.6 g of Fe powder (=1.65 mol=3 mol equiv.) in 420 ml of ethanol was refluxed. Upon refluxing 400 ml of acetic acid (=6.6 mol=12 mol equiv.) was added. A proper cooling and a safe gas separation were ensured. During the first reaction step a very strong exothermic gas release occurred. After completing of the addition of acetic acid, stirring while refluxing was continued for 60 min. After TLC inspection 300 ml of ethyl acetate was added and the Fe salts were suction-filtered. The salts were then washed with 1.9 L of ethyl acetate. While stirring, 138 ml of HCl conc. (1.65 mol=3 equiv.) was added to the filtrate. The mixture was cooled to 5° C. while stirring. The precipitate was suction-filtered and washed with ethyl acetate. After drying at 40° C. 85 g of N-(4-amino phenyl)-2-methyl acrylamide hydrochloride was obtained (i.e. 72% versus 117 g theor.)

3. Synthesis of sodium methacrylamido-2-(3-phenyl-1-methyl-2-triazenyl)ethanesulfonate A suspension of 8 g of N-(4-amino phenyl)-2-methyl acrylamide hydrochloride (=37.6 mol) in 38 ml of demineralized water was cooled to 10° C. After adding 8.6 ml of HCl conc. (=2.75 equiv.) cooling was continued to 5° C. Next, a solution of 2.7 g of sodium nitrite (=1.05 equiv.) in 5 ml of H$_2$O was added dropwise. After stirring for 20 min at 5° C.

the solution obtained was added to a solution of 6.7 g of sodium methyltaurine (=40 mmol=1.1 equiv.) and 12 g of Na$_2$CO$_3$ (=3.0 equiv.) in 50 ml of demineralized water. After stirring for 1 h at 5° C. the reaction mixture was poured in 400 ml of ethanol. The salts were suction-filtered and the filtrate was concentrated by evaporation. The residue was agitated in a mixture of 300 ml of isopropanol. The suction-filtered product still contained part of the salts. After drying the obtained precipitate was agitated for 1 h in 350 ml of MeOH at 50° C. The warm mixture was filtered and the filtrate was concentrated by evaporation. The obtained residue was agitated in EtOAc, the precipitate was filtered, washed with EtOAC and dried at 25° C. Yield 5.7g sodium methacrylamido-2-(3-phenyl-1-methyl-2-triazenyl) ethanesulfonate (i.e. 43% versus 13.1 g theor.)

Preparation of Triazenylsulfonate Polymer

The described copolymer is a copolymer of methylmethacrylate (I) and sodium methacrylamido -2-(3-phenyl-1-methyl-2-triazenyl) ethanesulfonate (II):

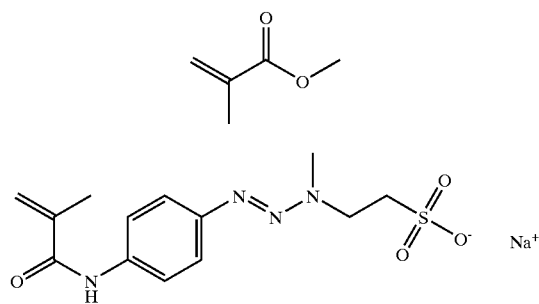

The preparation of a copolymer composed of 78 mol % methylmethacrylate and 22 mol % of sodium methacrylamido-2-(3-phenyl-1-methyl-2-triazenyl) ethanesulfonate is given. The copolymerization is performed in a 100 ml 3-neck roundbottom flask with magnetic stirrer, cooler, and a nitrogen inlet. The polymerization is performed in a darkroom using yellow light, in order to prevent premature decomposition of the light sensitive triazene unit. The copolymerization is performed in a water/isopropanol 40/60 weight-ratio mixture, using 4,4'-azobis (4-cyanopentanoic acid, sodium salt) as initiator during 24 hours at a polymerization temperature of 70° C. The reaction was performed on basis of a solid content of 15 wt %. In total 6% (wt) of azo-initiator was used on basis of the total monomer weight, of which 70% is added at the start of the polymerization and 30% is added after 6 hours. The sodium methacrylamido-2-(3-phenyl-1-methyl-2-triazenyl) ethanesulfonate (1.86 grams, 5.34 mmol), 3.15 gram of an 5% aqueous initiator solution and some additional water (4.13 grams) are combined in the roundbottom flask and subsequently dissolved at room temperature. Subsequently, the methylmethacrylate (1.89 gram, 18.87 mmol) and the isopropanol (12.60 grams) are added to the aqueous solution. The flask is flushed with nitrogen, after which the roundbottom flask is heated up to 70° C. After 6 hours reaction time a second portion of initiator (1.35 gram of a 5 wt % aqueous azoinitiator solution) is added and the polymerization is continued overnight in order to obtain complete conversion of monomers. After a total reaction time 24 hours the reaction flask is cooled to room temperature. The polymer solution is used as obtained from the polymerization, without further purification. The final concentration of the obtained solution is 15.4 wt %, having a viscosity of 27.9 mPas.

Example 1

A coating solution was prepared by mixing the following ingredients:

| | |
|---|---|
| Water | 3.81 g |
| Isopropanol | 5.71 g |
| Methyl ethyl ketone | 3.92 g |
| 16.3% solution of the aryldiazosulfonate copolymer in a mixture of water/isopropanol (40/60) | 3.18 g |
| 1% solution of Patent Blau V in methyl ethyl ketone | 5.63 g |
| 1% solution of s-triazine in methyl ethyl ketone | 1.50 g |
| 1% solution of BDEABP in methyl ethyl ketone | 1.25 g |

The pH of this solution was adjusted to pH=3 with HCl (1N). The coating solution was coated to a wet coating thickness of 20 µm on an electrochemically grained and anodized aluminum substrate, resulting in a dry coating composition according to table 1.

Then the plate was exposed on an UV contact frame (Printon CDL1502i UV contact frame from Agfa) through an UGRA-Offset-Testkeil 1982 step wedge (available from UGRA) using an exposure time of 600 units at level 3. The UV-sensitivity was 4 mW/cm$^2$ (measured with an IL1440 UV-intensity meter equipped with a CB97 cell-MUG2 filter available from International Light Inc.).

After processing the plate was mounted on a Heidelberger GTO52 printing press using K+E 800 Skinnex Black (available from BASF) as ink and Rotamatic (available from Unigrafica GmbH) as fountain. First the fountain rollers were dropped allowing to wet the plate. After 10 revolutions the ink rollers were dropped and printing was started.

The sensitivity was calculated based on the number of solid black steps on the print. The results are summarized in table 2.

Example 2

A coating solution was prepared by mixing the following ingredients:

| | |
|---|---|
| Water | 3.28 g |
| Isopropanol | 6.25 g |
| Methyl ethyl ketone | 7.24 g |
| 16.3% solution of the aryldiazosulfonate copolymer in a mixture of water/isopropanol (40/60) | 3.18 g |
| 1% solution of Patent Blau V in methyl ethyl ketone | 0.06 g |
| 1% solution of HABI in methyl ethyl ketone | 4.61 g |
| 1% solution of BDEABP in methyl ethyl ketone | 0.26 g |
| 1% solution of MBO in methyl ethyl ketone | 0.16 g |

The pH of this solution was adjusted to pH=3 with HCl (1N). The coating solution was coated to a wet coating thickness of 20 µm on an electrochemically grained and anodized aluminum substrate, resulting in a dry coating composition according to table 1.

Then the plate was exposed on an UV contact frame (Printon CDL1502i UV contact frame from Agfa) through an UGRA-Offset-Testkeil 1982 step wedge (available from UGRA) using an exposure time of 600 units at level 3. The UV-sensitivity was 4 mW/cm$^2$ (measured with an IL1440 UV-intensity meter equipped with a CB97 cell-MUG2 filter available from International Light Inc.).

After processing the plate was mounted on a Heidelberger GTO52 printing press using K+E 800 Skinnex Black (available from BASF) as ink and Rotamatic (available from Unigrafica GmbH) as fountain. First the fountain rollers were dropped allowing to wet the plate. After 10 revolutions the ink rollers were dropped and printing was started.

The sensitivity was calculated based on the number of solid black steps on the print. The results are summarized in table 2.

Example 3

A coating solution was prepared by mixing the following ingredients:

| Water | 1.31 g |
|---|---|
| Isopropanol | 1.96 g |
| Methyl ethyl ketone | 8.58 g |
| 16.3% solution of the aryldiazosulfonate copolymer in a mixture of water/isopropanol (40/60) | 2.45 g |
| 1% solution of Patent Blau V in methyl ethyl ketone | 4.50 g |
| 2.5% solution Triazine P in methyl ethyl ketone | 1.20 g |

The pH of this solution was adjusted to pH=3 with HCl (1N). The coating solution was coated to a wet coating thickness of 20 μm on an electrochemically grained and anodized aluminum substrate, resulting in a dry coating composition according to table 1.

Then the plate was exposed on an UV contact frame (Printon CDL1502i UV contact frame from Agfa) through an UGRA-Offset-Testkeil 1982 step wedge (available from UGRA) using an exposure time of 600 units at level 3. The UV-sensitivity was 4 mW/cm$^2$ (measured with an IL1440 UV-intensity meter equipped with a CB97 cell-MUG2 filter available from International Light Inc.).

After processing the plate was mounted on a Heidelberger GTO52 printing press using K+E 800 Skinnex Black (available from BASF) as ink and Rotamatic (available from Unigrafica GmbH) as fountain. First the fountain rollers were dropped allowing to wet the plate.

After 10 revolutions the ink rollers were dropped and printing was started.

The sensitivity was calculated based on the number of solid black steps on the print. The results are summarized in table 2.

Example 4

A coating solution was prepared by mixing the following ingredients:

| Water | 3.34 g |
|---|---|
| Isopropanol | 5.01 g |
| Methyl ethyl ketone | 9.51 g |
| 17.3% solution of the triazenylsulfonate copolymer in a mixture of water/isopropanol (40/60) | 3.15 g |
| 1% solution of Patent Blau V in methyl ethyl ketone | 1.25 g |
| 2.5% solution Triazine P in methyl ethyl ketone | 1.50 g |
| 2.5% solution of leuco crystal violet | 1.25 g |

The coating solution was coated to a wet coating thickness of 20 μm on an electrochemically grained and anodized aluminum substrate.

Then the plate was exposed on an UV contact frame (Printon CDL1502i UV contact frame from Agfa) through an UGRA-Offset-Testkeil 1982 step wedge (available from UGRA) using an exposure time of 1200 units at level 3. The UV-sensitivity was 4 mW/cm$^2$ (measured with an IL1440 UV-intensity meter equipped with a CB97 cell-MUG2 filter available from International Light Inc.).

After processing the plate was mounted on a Heidelberger GTO52 printing press using K+E 800 Skinnex Black (available from BASF) as ink and Rotamatic (available from Unigrafica GmbH) as fountain. First the fountain rollers were dropped allowing to wet the plate. After 10 revolutions the ink rollers were dropped and printing was started. Excellent prints were obtained.

Comparative Example

A coating solution was prepared by mixing the following ingredients:

| Water | 3.71 g |
|---|---|
| Isopropanol | 5.56 g |
| Methyl ethyl ketone | 6.62 g |
| 16.3% solution of the aryldiazosulfonate copolymer in a mixture of water/isopropanol (40/60) | 3.49 g |
| 1% solution of Patent Blau V in methyl ethyl ketone | 5.63 g |

The pH of this solution was adjusted to pH=3 with HCl (1N). The coating solution was coated to a wet coating thickness of 20 μm on an electrochemically grained and anodized aluminum substrate, resulting in a dry coating composition according to table 1.

Then the plate was exposed on an UV contact frame (Printon CDL1502i UV contact frame from Agfa) through an UGRA-Offset-Testkeil 1982 step wedge (available from UGRA) using an exposure time of 600 units at level 3. The UV-sensitivity was 4 mW/cm$^2$ (measured with an IL1440 UV-intensity meter equipped with a CB97 cell-MUG2 filter available from International Light Inc.).

After processing the plate was mounted on a Heidelberger GTO52 printing press using K+E 800 Skinnex Black (available from BASF) as ink and Rotamatic (available from Unigrafica GmbH) as fountain. First the fountain rollers were dropped allowing to wet the plate. After 10 revolutions the ink rollers were dropped and printing was started.

The sensitivity was calculated based on the number of solid black steps on the print. The results are summarized in table 2.

Reference Example

A commercially available UV-sensitive pre-sensitized printing plate, N71 from Agfa-Gevaert based on diazonium salts which require alkaline processing, was exposed on a UV contact frame (Printon CDL1502i UV-contact frame available from Agfa) through an UGRA-Offset-Testkeil 1982 step wedge (available from UGRA) using an exposure time of 600 units at level 3. The UV-sensitivity was 4 mW/cm$^2$ (measured with an IL1440 UV-intensity meter equipped with a CB97 cell-MUG2 filter available from International Light Inc.).

Then the plate was processed in a Ozasol VA-88 E-P processor (available from Agfa) (lm/min at 25° C.) using Ozasol EN223 (available from Agfa) as developer (alkaline solution).

After processing the plate was mounted on a Heidelberger GTO52 printing press using K+E 800 Skinnex Black (available from BASF) as ink and Rotamatic (available from Unigrafica GmbH) as fountain. First the fountain rollers were dropped allowing to wet the plate. After 10 revolutions the ink rollers were dropped and printing was started.

The sensitivity was calculated based on the number of solid black steps on the print. The results are summarized in table 2.

TABLE 1

Composition of the coatings (wt. %)

| | ADS-polymer | Patent Blau | s-Triazine | HABI | BDEABP | MBO | Triazine P |
|---|---|---|---|---|---|---|---|
| Comp. Example | 91 | 9 | — | — | — | — | — |
| Example 1 | 83 | 9 | 6 | — | 2 | — | — |
| Example 2 | 87 | 9 | — | 4.0 | 0.2 | 0.1 | — |
| Example 3 | 85 | 9 | — | — | — | — | 6 |

TABLE 2

| | Sensitivity |
|---|---|
| Comp. Example | 450 mJ/cm$^2$ |
| Example 1 | 240 mJ/cm$^2$ |
| Example 2 | 240 mJ/cm$^2$ |
| Example 3 | 240 mJ/cm$^2$ |
| Reference Example | 240 mJ/cm$^2$ |

From these examples it is clear that the addition of radical generating compounds results in a sensitivity increase of the aryldiazosulfonate photochemistry and results in a final plate sensitivity comparable to negative conventional plates.

We claim:

1. An imaging element for making a lithographic printing plate comprising a lithographic support and an imaging layer comprising
   (i) a polymer having aryldiazosulfonate units and/or aryltriazenylsulfonate units and
   (ii) a compound capable of generating a radical and/or an acid upon exposure to UV light.

2. Imaging element according to claim 1 wherein said polymer having aryldiazosulfonate units corresponds to the following formula (I):

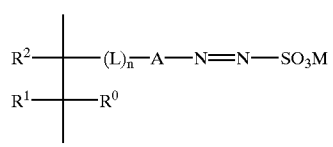

(I)

wherein $R^{0,1,2}$ each independently represent hydrogen, an alkyl group, a nitrile group or a halogen group, L represents a divalent linking group, n represents 0 or 1, A represents an aryl group and M represents a cation.

3. Imaging element according to claim 1 wherein said polymer having aryltriazenylsulfonate units corresponds to the following formula (II):

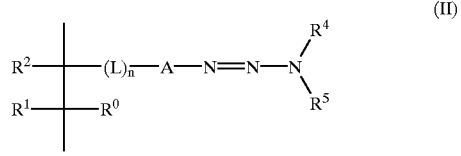

(II)

wherein $R^{0,1,2}$ each independently represent hydrogen, an alkyl group, a nitrile group or a halogen group, L represents a divalent linking group, n represents 0 or 1, and A represents an aryl group and wherein $R^4$ and $R^5$ are independent and represent a hydrogen, a heterocyclic group, an aliphatic group, an aromatic group or an alicyclic group; and at least one of $R^4$ and $R^5$ is substituted with a sulfonate group.

4. Imaging element according to claim 1 wherein said compound capable of generating a radical upon exposure to UV-light is selected from the group consisting of triazines, thioxanthones, imidazoles or mercaptobenzoxazoles.

5. Method for making a lithographic printing plate comprising the steps of:
   1. providing an imaging element comprising an imaging layer comprising (i) a polymer having aryldiazosulfonate units and/or aryltriazenylsulfonate units and (ii) a compound capable of generating a radical and/or an acid upon exposure to UV light;
   2. image-wise exposing said imaging element to UV-light;
   3. mounting the imaging element on a press; and
   4. developing the imaging element by applying water or an aqueous solution.

6. Method according to claim 5, wherein the aqueous solution is a fountain solution.

7. Method according to claim 5, wherein during the developing step also ink is provided.

8. Method according to claim 5, wherein first fountain and subsequently ink is applied.

9. Method according to claim 5, comprising an additional step of overall UV-exposing the developed imaging element.

* * * * *